April 19, 1966 S. J. SATONICK 3,246,598

METHOD OF MAKING A SILK SCREEN

Filed Sept. 17, 1963

INVENTOR.
Stanley J. Satonick

BY

Johnson and Kline

ATTORNEYS

United States Patent Office 3,246,598

Patented Apr. 19, 1966

3,246,598

METHOD OF MAKING A SILK SCREEN

Stanley J. Satonick, Bristol, Conn., assignor to The Superior Electric Company, Bristol, Conn., a corporation of Connecticut Filed Sept. 17, 1963, Ser. No. 309,436
2 Claims. (Cl. 101—128.3)

The present invention relates to a method of making a silk screen image to enable forming a positive of the image and more particularly to such an image that has open block areas.

While the method of the present invention may be employed in many areas of silk screen work, it has been found to have especial utility in the making of printed circuit boards for electrical circuits. Normally the steps in making a printed circuit board include the drafting of a working print or blueprint, generally to an enlarged scale, of the circuit board. On the blueprint the conducting portions of the board are made quite accurately to scale and delineated by a continuous line. Additionally, the blueprint may include dimensions for showing the relative distances between the various elements. From the blueprint, an art work original is made, usually on stiff white board, with the conducting areas being drawn accurately in position and instead of being delineated by a continuous line are filled or "blocked in" by either India ink, black tape, etc. The art work original is then photographed onto photosensitive silk screen film. The latter is then developed to produce an image that is transferable to a silk screen to enable forming positive printed circuit boards therefrom.

Though the above steps produce a satisfactory printed circuit board, it will be appreciated that the forming of an art work original is essentially a duplication of the drafting of the blueprint, is somewhat expensive and only serves to enable the forming of an image in which the conducting areas are caused to be open block areas in the original rather than just being delineated by a continuous line as in the blueprint.

It is accordingly an object of the present invention to produce an image for use in silk screen processes in which there are open block areas but yet in which the step of requiring an art work original is eliminated.

Another object of the present invention is to provide a method of making a silk screen image having open block areas from an original in which block areas are only delineated by a continuous line for each area.

A further object of the present invention is to provide a method that achieves the above-noted objects and which is economical to practice and produces an accurate image.

In practicing the present invention, while reference is specifically made herein to printed circuit boards, the present invention is to be considered equally applicable to areas of silk screen work in which a positive is made having filled block areas from an image having corresponding open areas. Initially, a working drawing or blueprint is made of the desired printed circuit board with the blueprint showing the areas of the board wherein it is desired to have conducting segments formed in the final board. Each of said areas on the blueprint is indicated by a continuous line without there being any blocking of the area within the continuous line. The blueprint does not as yet have the usual dimensional indication and may be made on a scale much larger than that which the final printed circuit board is desired to have, for example, four times as large. In addition, the block areas are indicated accurately with respect to their shape and disposition and drawn with the tolerances necessary. The blueprint thus made is then caused to be photographed onto what is known as a screen process photofilm of the type having an emulsion adhered to a plastic base to produce an image and the emulsion is developed.

In accordance with the present invention, the image has block areas, each of which is delineated by a continuous line, the line being in the image an absence of the developed emulsion and corresponding to the continuous line in the blueprint. In order to produce the open areas in the image, the present invention utilizes the step of hardening or elasticizing the developed emulsion and reducing its adherence to the plastic base by the application of a liquid to at least the block areas defined by continuous lines. After the application of the liquid, the developed emulsion within each continuous line is then grasped and by reason of the liquid causing cohesion of the developed emulsion and substantially destroying the adherence of the emulsion to the plastic base, a stripping process is effected that enables the stripping of the developed emulsion within the continuous line on the image to thereby produce an open block area in the image. By performing this operation on each of the block areas delineated by a continuous line, there is accordingly produced an image in which the block areas are open, the same as would be produced if an art work original were made.

After forming the open block area image, the usual steps in preparing a silk screen are then followed, these include the adhering of the image to a silk screen and the removal of the plastic base. The silk screen is then employed to apply through the open block areas, paint or other chemicals to the selected portion on the material on which the positive is to be formed in a manner which is well known in the art.

Other features and advantages will hereinafter appear.

Figure 1:
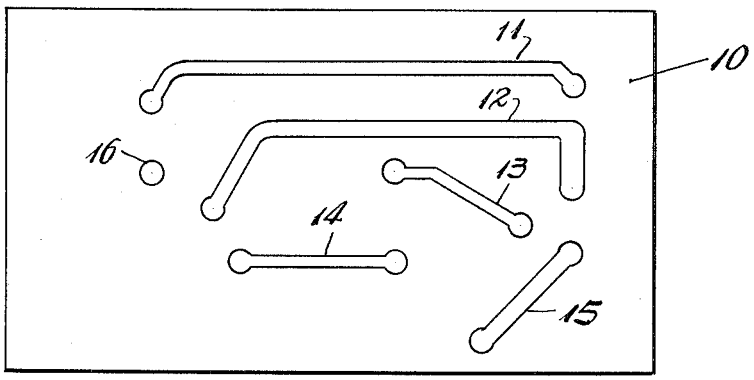
FIGURE 1 is a diagrammatic representation of a blueprint of which a silk screen image is to be produced.

Referring to the drawing, there is shown in FIG. 1 a sheet of paper or blueprint 10 on which is drawn continuous lines 11, 12, 13, 14, 15 and 16, each of the lines defining the shape and disposition of a block area that is to appear in a positive made from a silk screen image as an open block area. The continuous lines are drawn with accuracy both as to the position of the lines with respect to each other and also as to the thickness and extent of the block area within the lines. The blueprint 10 is a substantial completion of the working drawing of the positive, the only addition being required to complete the drawing is the dimensions and other data such as that concerning mechanical operations, material, etc. In addition the blueprint 10 is preferably drawn to a scale larger than that which the positive is desired to be so that it may be drawn with greater accuracy.

Figure 2:
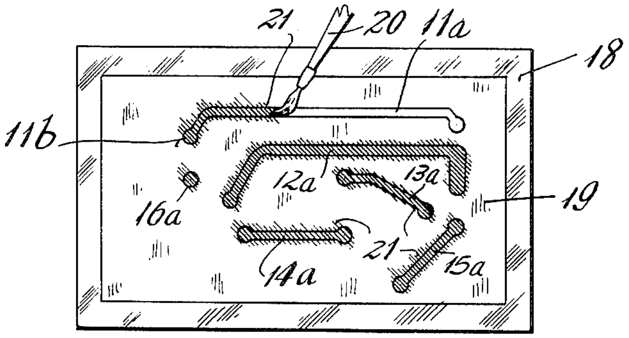
FIG. 2 is a diagrammatic representation of the developed image showing the application of a liquid to at least the portions of the image delineated by continuous lines.

After making the blueprint, as above described, the blueprint is then photographed onto a screen process photofilm of the type having a developable emulsion secured onto a plastic base. In the photography process, as is well known in the art, the image produced onto the film may be in the photographing process reduced in size to the size desired for the positive. The film is then subsequently developed and appears as pictorially represented in FIG. 2 to have a plastic backing, indicated by the reference numeral 18, and an area of developed emulsion 19. In addition each of the lines 11 through 16 in the blueprint 10 may be merely pencil lines and appears in the developed emulsion 19 as a line caused by the absence of any emulsion 19.

Figure 3:
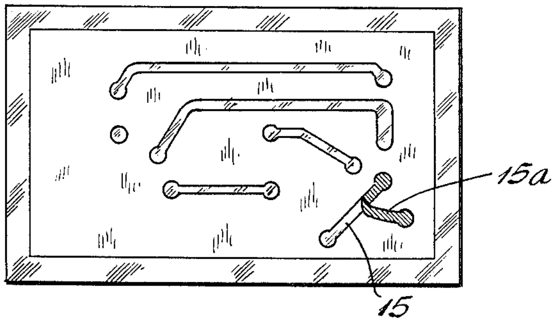
FIG. 3 is a view similar to FIG. 2 of the image where substantially all of the block areas have been caused to become open.
Figure 4:
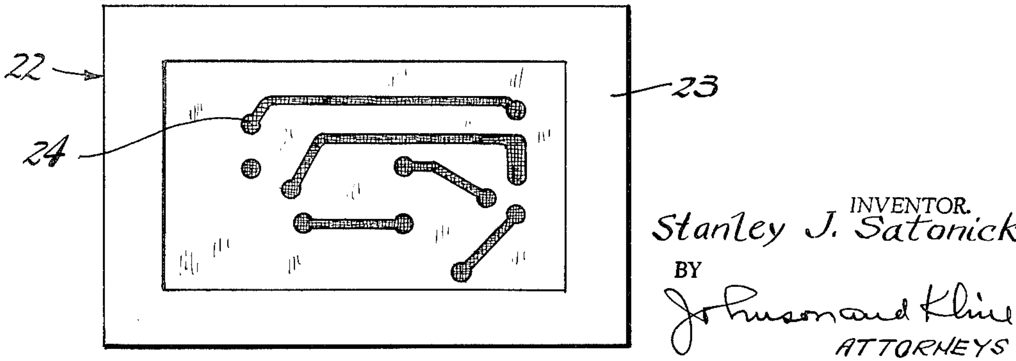
FIG. 4 is a view of a silk screen having the image applied thereto.

In carrying out the present invention in order to provide open areas, i.e. a lack of emulsion 19 in the areas delineated by the lines 11 through 16, there is applied as by a swab or brush 20 to the emulsion 11*a* through 16*a* within the lines 11 through 16 respectively, a solution that destroys the adhesion of the emulsion 19 to the plastic base 18 and also serves to toughen, harden or otherwise cause the emulsion 19 to cohere. The liquid is generally indicated by the reference numeral 21 and areas of its application are shown by the crosshatching in FIG. 2. The next step in the process of the present invention is to grasp, for example, the corner or edge portion 11*b* of the emulsion 11*a* with a pair of tweezers or by fingers and pull or strip the emulsion 11*a* within the line 11 from the plastic base. This is more particularly shown in FIG. 3 where the emulsion 15*a* is shown being stripped away from the area delineated line by the reference numral 15. Aftr each of the block areas in the developed image have thus been caused to become open block areas by the stripping away of the developed emulsions 11*a*–16*a*, there is thus produced a silk screen image which may be then applied to a silk screen 22 having a rigid border 23 and a screen or netting 24 formed of silk, synthetic fibers or metal.

The emulsion 19 is applied to the screen 24 by using the commonly accepted steps of adherence and the peeling of the backing sheet from the emulsion after the film has become adhered to the screen. The screen is now formed and may be utilized to form positives by the application of liquid through the open block areas in the screen as is well known in the art.

In order to enable one skilled in the art to readily practice the invention it has been found that a screen process photofilm of the type known as "hi-fi" red available from J. Ulano and Company, Inc., Brooklyn, N.Y. may be employed in the present invention though of course others having the same characteristics may accordingly be similarly employed. Such a film has the backing 18 formed of transparent plastic material, such as that sold under the trade name "Mylar" and a water soluble emulsion 19. In addition the liquid 21 that is applied to the emulsion after it defines the developed image to cause it to cohere and to be strippable from the backing 18 may consist of five parts glycerin, 10 parts water, and 85 parts isopropyl alcohol. Such a liquid is capable of evaporating after a short time without detriment to any emulsion that it contacts that is left on the backing 18 and thus obviates care in applying it only to the block areas of the emulsion. The stripping is accomplished prior to the complete evaporation of the liquid as after evaporation the emulsion reverts to its normal characteristics. Naturally, under different conditions these proportions will vary and while a specific example of a liquid has been herebefore given, it will be appreciated that other liquids causing the same effect on the film may be employed. It will be appreciated that developed emulsion 19 without the addition of the liquid is brittle, lacks cohesion, is adhered to the plastic backing 18, and is incapable of being peeled as a unitary piece from the plastic backing 18.

Though the present invention has been described in connection with the making of a printed circuit board, it will be appreciated that the invention is not limited thereto but may be employed in any silk screen work which requires that there be open block areas in the silk screen image, such as areas that define letters, numbers and so forth.

While the specific above-described method of practicing the present invention sets forth that the blueprint 10 is photographed to directly produce the image on the emulsion 19, it will be appreciated that intermediate steps may be performed to achieve the same result if so desired. Thus, for example, if desired the blueprint 10 may be photographed on conventional photography film to produce a negative, a positive may then be made from the negative on what is known as auto-positive film to produce a positive and then the image on the emulsion 19 may be made from the developed auto-positive film. Alternatively, if desired, the auto-positive film image may be made directly from the blueprint without first making the photographic negative image. In either of these steps, a change in size from blueprint 10 to the emulsion image 19 may be easily effected.

It has also been found that with images which are exceedingly detailed and have small block areas that the stripping of the block areas may be difficult because of their size, closeness, etc. However, the present invention may be employed to form what has heretofore been termed "an art work copy." Thus, for example, in such a situation an image on an emulsion 19 may be made larger than that finally desired. The stripping or peeling from the block areas may then be effected and then the desired size of silk screen image may be made by photographing to a reduced scale the enlarged image onto the silk screen film. In this process, it will be appreciated that the need for an art work copy of the blueprint 10 is obviated.

It will be accordingly appreciated that there has been disclosed the step of producing a silk screen image which eliminates the necessity of providing an art work original or of having on an original the areas which occur as open areas in the image, to be blocked in. Thus, the present invention merely requires that on the original, which is preferably just the usual working drawing or blueprint without the dimensional characteristics therein may be original and that the open areas merely be delineated by a continuous line. The line appears in the developed image and by the application of a material which serves to harden the emulsion of the image and cause the destruction of the adherence between the film and the backing layer, the part of the emulsion within the continuous lines may accordingly be easily stripped away from the backing layer thereby leaving an open block area in the image which area is desired to be produced in the positive.

Variations and modifications may be made within the scope of the claims and portions of the improvements may be used without others.

I claim:

1. The method of preparing an image having open block areas from an original having closed block areas that are each delineated by a continuous line comprising the steps of supplying an original with block areas delineated only by a continuous line and made to an enlarged scale, forming a developed image on a reduced scale of said original on a photosensitive film secured to a backing sheet with each block area being delineated by a continuous line formed by the absence of developed film and having a film portion within each area, said film portions being normally when dry incapable of being peeled from the backing sheet, increasing the coherence of the film and decreasing the adherence of the film to the backing sheet by wetting the portions of the film at least within each block area, stripping the portion of the film within each block area from the backing sheet to form an image with open block areas while the film is still wet, and drying the film and backing sheet to have said film and backing sheet resume their normal characteristics of the film being more adherent to the backing sheet than coherent to itself.

2. The invention as defined in claim 1 and including the step of securing the film to a screen and removing the backing sheet from the film to form a silk screen for printing positives.

(References on following page)

References Cited by the Examiner

UNITED STATES PATENTS

| | | | |
|---|---|---|---|
| 1,030,159 | 6/1912 | Bosshardt. | |
| 1,327,931 | 1/1920 | Waters | 101—128.3 |
| 2,064,764 | 12/1936 | Playford et al. | 101—128.3 |
| 2,131,225 | 9/1938 | Kirch et al. | 101—128.3 |
| 2,281,909 | 5/1942 | Barsky et al. | 101—128.2 |
| 2,943,936 | 7/1960 | Spechler | 96—35 X |
| 3,067,034 | 12/1962 | Chapman | 96—35 |

OTHER REFERENCES

Eisler, P.; The Technology of Printed Circuits, London, Heywood & Co., Ltd., 1959, pp. 72 to 82 and 85 to 88. TK 7870. E32, 1959a.

Photo Methods for Industry, vol. 3, No. 3, February 1960, pp. 54, 55 and 91. (Copy in Group 470.)

ROBERT E. PULFREY, *Primary Examiner.*

DAVID KLEIN, *Examiner.*

N. A. HUMPHRIES, *Assistant Examiner.*